United States Patent [19]

Malhi

[11] Patent Number: 5,734,180
[45] Date of Patent: *Mar. 31, 1998

[54] HIGH-PERFORMANCE HIGH-VOLTAGE DEVICE STRUCTURES

[75] Inventor: Satwinder Malhi, Garland, Tex.

[73] Assignee: Texas Instruments Incorporated, Dallas, Tex.

[*] Notice: The term of this patent shall not extend beyond the expiration date of Pat. No. 5,589,695.

[21] Appl. No.: 658,297

[22] Filed: Jun. 5, 1996

Related U.S. Application Data

[63] Continuation of Ser. No. 459,369, Jun. 2, 1995, Pat. No. 5,589,695.
[51] Int. Cl.⁶ .................... H01L 27/01; H01L 29/68; H01L 29/78
[52] U.S. Cl. .................... 257/77; 257/347; 257/339; 257/506
[58] Field of Search .................... 257/347, 343, 257/492, 336, 348, 491, 501, 506, 77

[56] References Cited

U.S. PATENT DOCUMENTS

| | | | |
|---|---|---|---|
| 4,593,458 | 6/1986 | Adler | 257/336 |
| 5,081,062 | 1/1992 | Vasudev et al. | 257/347 |
| 5,286,985 | 2/1994 | Taddiken | 257/200 |
| 5,338,965 | 8/1994 | Malhi | 257/482 |

*Primary Examiner*—Donald Monin
*Attorney, Agent, or Firm*—Jacqueline J. Garner; W. James Brady III; Richard L. Donaldson

[57] ABSTRACT

An improved high-voltage device structure (10, 50, or 60) is a hybrid silicon-based/non-silicon-based power device that has a low $R_{ds(on)}$ relative to devices formed using only a silicon substrate and includes control circuit (14, 14', or 14") formed on silicon substrate region (12 or 62). High-voltage circuit (16, 16' or 16") is formed in non-silicon substrate region (18). Connecting circuitry (34 and 66) connects control circuit (14, 14', and 14") with high-voltage circuit (16, 16' or 16") to form high-voltage device structure (10, 50 or 60) that has improved control circuit performance and improved high-voltage circuits performance over devices formed solely from a silicon substrate or solely from a non-silicon substrate.

19 Claims, 3 Drawing Sheets

HIGH-PERFORMANCE HIGH-VOLTAGE DEVICE STRUCTURES

This is a Continuation of application Ser. No. 08/459,369, filed on Jun. 2, 1995, now U.S. Pat. No. 5,589,695.

TECHNICAL FIELD OF THE INVENTION

The present invention generally relates to semiconductor devices and processes and, more particularly, to high-performance, high-voltage device structures and methods for making such structures.

BACKGROUND OF THE INVENTION

A growing segment of the semiconductor industry is in the manufacture of high-voltage/high-power devices and integrated circuits. A critical element in this developing technology is the power MOSFET. Power devices such as power MOSFETs operate in a manner similar to a mechanical relay and have the advantage over mechanical relays of being smaller and more reliable. Power MOSFETs have many diverse applications in automotive, communications, consumer, data processing, industrial and military product and equipment. For example, power MOSFETs may be used as drivers for motors, lamps, and displays. Most power MOSFETs are built in silicon. However, the attractive performance characteristics of power MOSFETs built in silicon already approach theoretical performance limits.

SUMMARY OF THE INVENTION

Accordingly, there is a need for an improved high voltage power device that overcomes the limitations associated with silicon-based power devices.

There is a need for an improved high-voltage power device that provides improved performance characteristics to further reduce the cost of high-voltage, high-power devices.

The present invention, accordingly, provides a high-performance, high-voltage power device and a method of forming the device that overcomes or reduces disadvantages and limitations associated with known high-voltage device structures and methods for making such structures.

One aspect of the invention is an improved high-voltage power device structure that has a low drain-source resistance in the on-state, $R_{ds(on)}$, relative to devices formed using only a silicon substrate and that includes a control circuit formed on a silicon substrate region. A high-voltage circuit is formed on a non-silicon substrate region that possesses a good figure-of-merit and has a low $R_{ds(on)}$ in its a high-voltage drift region. Connecting circuitry connects the control circuit with the high-voltage circuit to form a high-voltage device structure having improved control circuit performance and improved high-voltage circuit performance over devices formed solely from silicon substrate regions or solely from non-silicon substrate regions.

A technical advantage of the present invention is that it provides an improved high-performance, high-voltage device that possesses a lower $R_{ds(on)}$ than do known power devices. With the lower $R_{ds(on)}$, the high-voltage device "figure-of-merit" increases. The device figure-of-merit relates to its specific on-state resistance, $R_{sp}$, and directly affects the device $R_{ds(on)}$. A higher a device figure-of-merit means that the device is more efficient and, therefore, more economical for power device applications.

Another technical advantage of the present invention is that it uses established technology to fabricate the control circuit on a silicon substrate and established technology to form the high-voltage circuit from a material having a higher figure-of-merit and, hence, a lower $R_{ds(on)}$ than could a device having a silicon substrate. The high-voltage material may, for example, be GaAs or SiC. The combination of the two established technologies results in a hybrid fabrication process for making both the control circuit and the high-voltage circuit that synergistically takes advantage of known device processing technologies.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF ILLUSTRATIVE EMBODIMENTS

Figure 1:
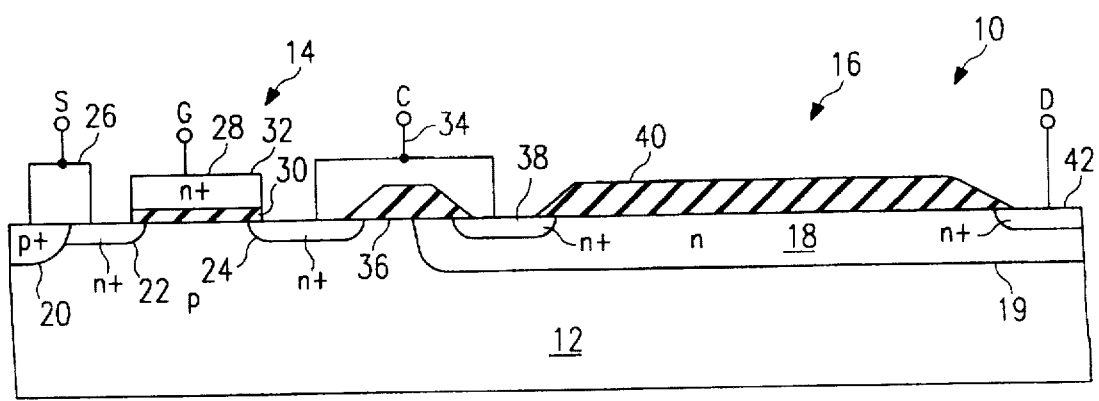
FIG. 1 shows a high-voltage device formed according to the present embodiment.

The illustrative embodiments of the present invention are best understood by referring to the FIGUREs, wherein like numerals are used for like and corresponding parts of the various drawings.

High performance control systems are possible if semiconductor power devices can be integrated with advanced logic and analog processes without major cost penalties. Such smart control solutions will accept multiple sensor inputs, perform analog signal conditioning and processing, provide decision and control functions, and drive multiple loads with on-chip power inputs. For such solutions to be viable, the semiconductor power devices must have low specific on-resistance ($R_{sp}$). For example, the present embodiment allows developing a leading edge 60-volt power device module that is compatible with advance logic and analog processes and that possesses a desirable $R_{sp}$. This leads to the expression of $1/R_{sp}$ as convenient "figure-of-merit" which should be maximized.

U.S. patent application Ser. No. (TI-17714) by Satwinder Malhi, which was filed and assigned to Texas Instruments Incorporated on Feb. 22, 1993, which has the title "Device and Method for High-Performance High-Voltage Operation", (hereinafter Malhi) describes a high-voltage device having MOS input characteristics. Malhi is here incorporated by reference and describes the material properties and figure-of-merit for substrates such as GaAs and SiC. In particular, Malhi explains that the figure-of-merit may be approximated by the following relationship:

$$\text{figure-of-merit} = 1/R_{sp} \cong \epsilon \times \mu \times E_c^3, \tag{1}$$

where $\epsilon$ is the dielectric constant, $\mu$ is the carrier mobility, and $E_c^3$ is the avalanche electric field. The following TABLE 1 lists the properties of a few candidate materials that may be attractive for high-voltage power device operation.

TABLE 1

| Parameter | Symbol | Units | Si | GaAs | SiC |
|---|---|---|---|---|---|
| Relative Dielectric Constant | $\epsilon$ | C/v · cm | 11.8 | 12.8 | 9.7 |
| Mobility | $\mu$ | cm$^2$/V · sec. | 1400 | 8000 | 300 |
| Critical Field | $E_c$ | V/cm | $3 \times 10^5$ | $4 \times 10^5$ | $2.5 \times 10^5$ |
| Figure-of-merit | $\epsilon \cdot \mu \cdot E_c^3$ | — | $4.46 \times 10^{20}$ | $6.55 \times 10^{21}$ | $4.5510^2$ |
| Relative Figure-of-merit | — | — | 1 | 14.7 | 102 |

As Table 1 illustrates, GaAs and SiC have the potential of one and two orders of magnitude of improvement and performance in making high-voltage devices, respectively. Making enhancement mode MOSFETs in either GaAs or SiC, however, is difficult. For example, GaAs technology has problems in producing a high-quality gate insulator. Similar problems limit the use of SiC.

An advanced optimized reduce surface field (RESURF) lightly doped metal oxide semiconductor (LDMOS) device that is intended in low-side applications and suitable for integration into advanced CMOS and BiCMOS processes is described in T. Efland, et al., "An Optimized RESURF LDMOS Logic Device Module Compatible with Advance Logic Processes," International Electron Devices Meeting (IEDM) 1992, pp. 237–41 (hereinafter Efland). Those devices have 84-volt and 97-volt breakdown voltages and excellent $R_{sp}$ performance at CMOS- level gate drives. The descriptions of Efland are herein incorporated by reference. The devices of Efland could be further improved, as the present embodiment illustrates, to yield superior mobility or breakdown field strength using GaAs or SiC to improve the $R_{ds(on)}$ of the LDMOS device. The process technology, however, to grow a good gate oxide on GaAs or SiC does not presently exist and will probably take 10 to 20 years to develop.

Figure 2:
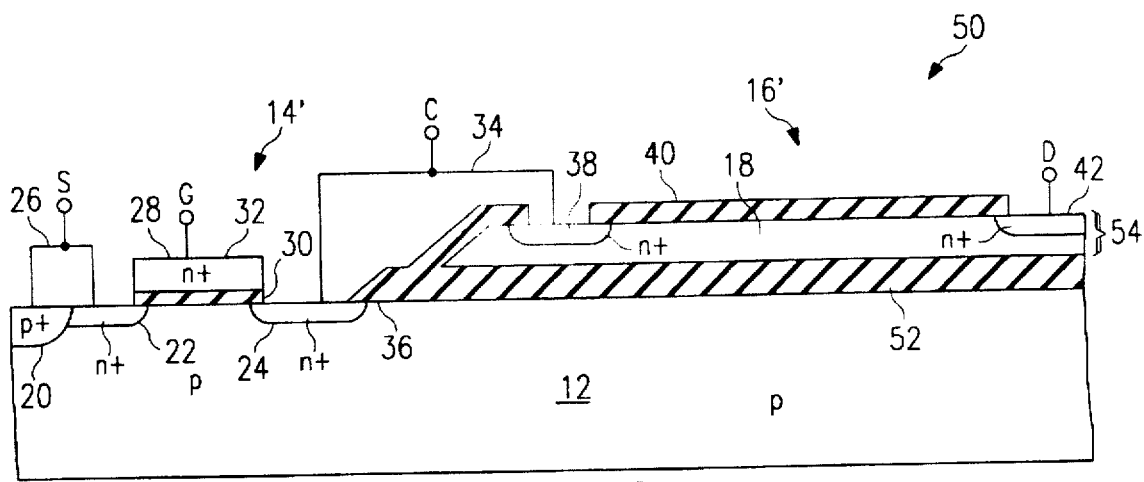
FIG. 2 shows another embodiment of the present invention.
Figure 3:
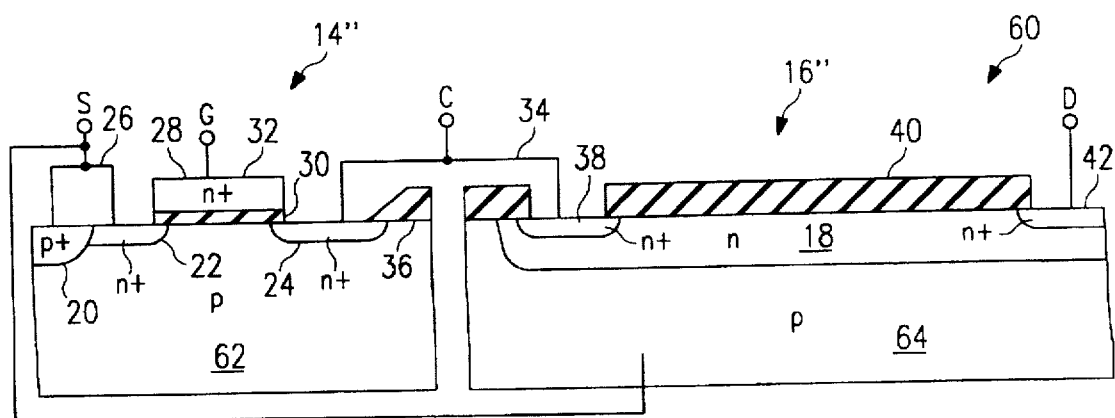
FIG. 3 illustrates a two-chip implementation of the present invention that includes a silicon low-voltage MOSFET in association with a high-voltage drift GaAs or SiC chip.

The present embodiments, consequently, encompass hybrid structures as the best choices for early implementation of GaAs or SiC power devices. These power devices may, for example, be ones that include an intrinsic low-voltage (LV) MOSFET built in bulk silicon that has a high-voltage (HV) drift region built in GaAs or SiC that has been epitaxially grown in the bulk silicon. FIG. 1 shows this embodiment. The GaAs or SiC, in another embodiment, may be disposed on a SiO$_2$ layer, as FIG. 2 illustrates. Alternatively, a two-chip implementation is feasible as FIG. 3 shows. These implementations are described in more detail in connection with FIGS. 1 through 3, below.

Referring more particularly to FIG. 1, there appears one of several embodiments for power device 10. On silicon substrate 12, LV MOSFET region 14 is built directly into silicon substrate 12 while HV drift region 16 is built in N layer 18 which may be, for example, formed in trench 19 within silicon substrate 12 and from a material having a high figure-of-merit such as GaAs or SiC. LV MOSFET region 14 includes P substrate region 12 into which are doped P+ region 20, N+ region 22, and N+ region 24. Source connector 26 connects to P+ region 20 and N+ region 22. Gate region 28 includes gate oxide layer 30 and N+ layer 32.

Common connector 34 connects between N+ region 24 and N+ region 38 of N layer 18. Oxide layer 40 connects between N+ region 38 and N+ region 42 to which drain 44 connects.

FIG. 2 shows another embodiment of the present invention in the form of power device 50 that is formed of materials similar to those of power device 10 of FIG. 1. A difference between power device 50 and power device 10 is that drift region 16, instead of being epitaxially grown in trench 19, is formed over SiO$_2$ layer 52. SiO$_2$ layer 52 may be formed by a variety of reliable fabrication processes. Power device 50, therefore, is formed on silicon substrate 12 and includes LV MOSFET 14', as described above in connection with FIG. 1. Drift region 16' is formed over SiO$_2$ layer 52 and includes N+ region 38 that connects in common with N+ region 24 of LV MOSFET 14'. N+ region 42 of drain 44 is embedded within N region 18. An advantage of power device 50 over power device 10 is that material quality problems that associate with forming trench 19 and epitaxially growing substrate region 18 do not arise when forming SiO$_2$ layer 52 to separate N region 18 of drift region 16'.

FIG. 3 shows yet a further illustrative embodiment in the form of power device 60 that uses two different chips. Power device 60 provides a control circuit in the form of LV MOSFET 14" on silicon substrate 62 and drift region 16" formed on GaAs or SiC substrate 64. Drift region 16" functions essentially similar to the drift regions 16 and 16' of FIGS. 1 and 2, respectively, but is formed on a substrate of GaAs or SiC, or some other material having a high figure-of-merit. Connection 66 connects P substrate 64 to source connection 26 to cause the power device operation for power device 60. Control circuit 14" and drift region 16" may be connected at the package level and wired together via lead 66.

Figure 4A:
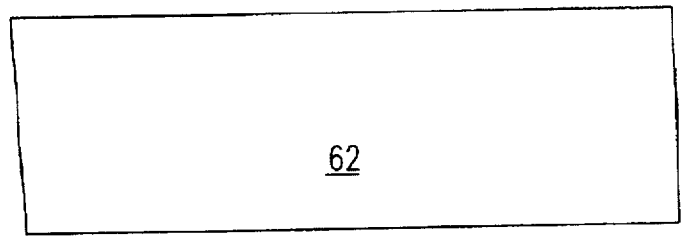
FIGS. 4a through 4f illustrate a fabrication process for the silicon-based low-voltage MOSFET of FIG. 3.
Figure 4B:
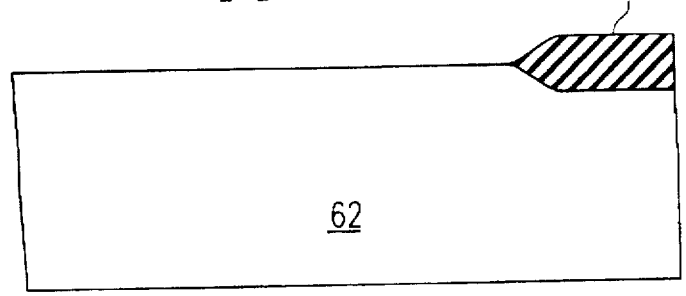
Figure 4C:
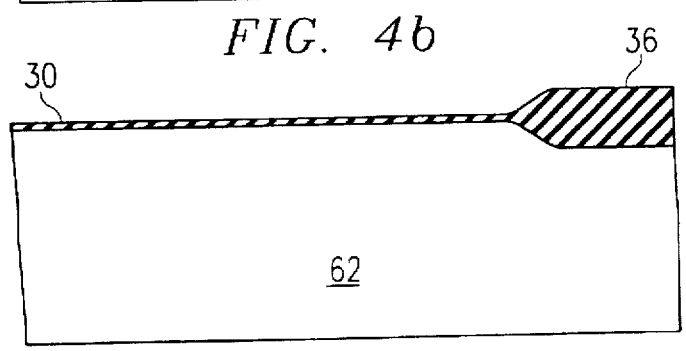
Figure 4D:
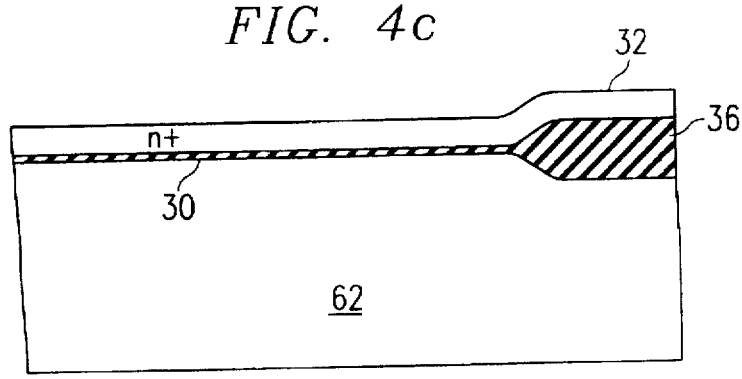
Figure 4E:
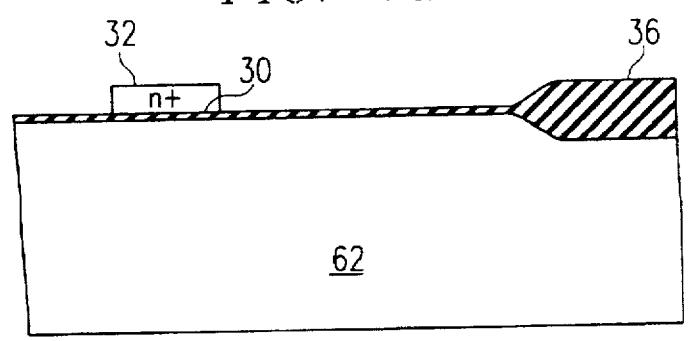
Figure 4F:
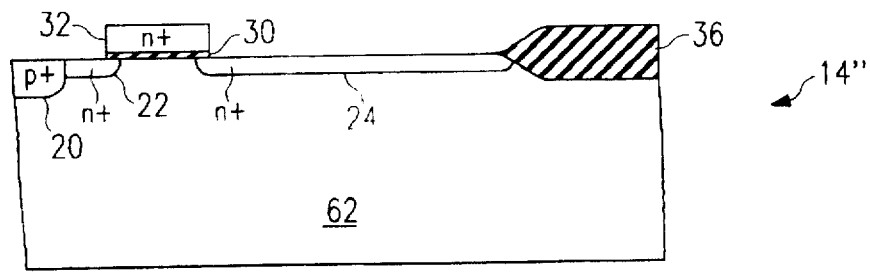

FIGS. 4a through 4f, and 5a through 5c illustrate one approach to fabricating power device 60 of FIG. 3. The fabrication process for LV MOSFET control circuit 14" begins with silicon substrate 62, as FIG. 4a illustrates, on which field oxide layer 36 is formed. Although dimensions or layer thicknesses are not critical to practicing the present invention, they are provided here to indicate relative proportions the various constitutes of the present embodiment. FIG. 4b, therefore, shows that field oxide layer 36 may be, for example, a LOCOS field oxide with a thickness of approximately 1 micron. Gate oxide layer 30 is then formed a thickness of approximately 500 Å, as FIG. 4c illustrates. A 5000 Å polysilicon layer 32 is then formed which is doped N+ region using a phosphorous oxytrichloride gas. FIG. 4d shows this step. At FIG. 4e, polysilicon layer 32 is etched to form N+ region 32 on gate oxide layer 30. Gate oxide layer 30 is then etched to expose silicon substrate 62. Silicon substrate 62 is then doped to form N+ regions 22 and 24. Finally, a P+ region 20 is patterned into substrate 62 to form LV MOSFET chip 14". This completes the formation of the various material portions of LV MOSFET chip 14". To this formation, source connection 26, gate connection 28, and common connection 34 attach.

Figure 5A:
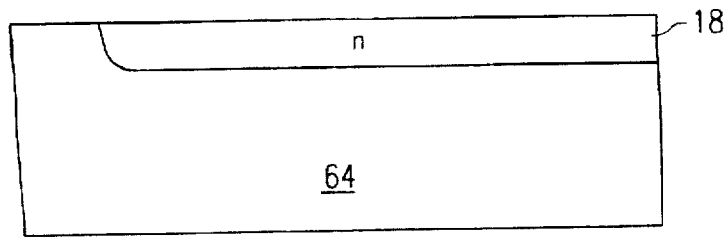
FIGS. 5a through 5c illustrate a fabrication process for the high-voltage chip of FIG. 3.
Figure 5B:
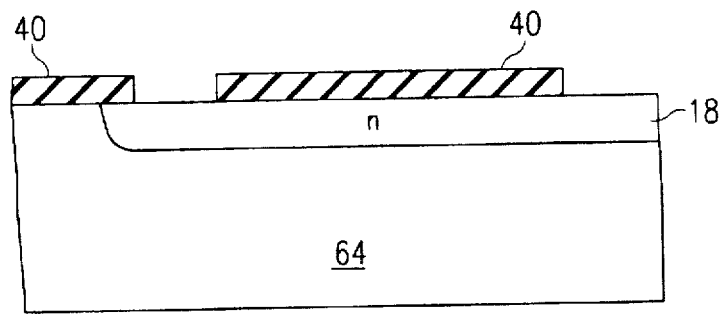
Figure 5C:
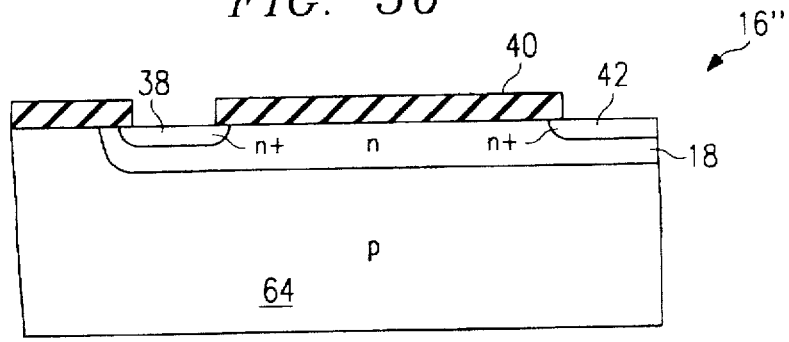

FIG. 5a illustrates that forming drift region 16 begins with a GaAs or SiC substrate 64. An N type diffusion is made on substrate 64 to form N region 18. Over N region 18, field oxide layer 40 is patterned, as depicted in FIG. 5b. Then, as FIG. 5c illustrates, N region 18 is doped with an N+ material to form N+ regions 30 and 42 to ultimately yield drift region chip 16" of power device 60. This completes the formation of the various material portions of drift region chip 16". To this formation common connection 34 and drain connection 44 attach.

The illustrative embodiments of FIGS. 1 through 3 have numerous technical advantages. In particular, one technical advantage is that known technologies can form the control circuit of LV MOSFET regions 14, 14' and 14", while known, more simple-fabrication processes can produce drift regions 16, 16' and 16". The fabrication processes for GaAs or SiC materials do not possess the technological sophistication or abilities of silicon-based technology. But, fabricating drift regions 16, 16' and 16" does not require a gate oxide. These illustrative embodiments, therefore, optimize the present stage of fabrication technology for semiconductor devices in forming a high-performance, high-voltage power device.

The illustrative embodiments take advantage of the technical sophistication of silicon technology and the reduced drain resistance of materials having high figure-of-merit such as GaAs and SiC. The result is a hybrid device that has the ability to reduce $R_{ds(on)}$ by a factor of 10. Therefore, the present embodiments require only 1/10th of the area necessary to produce the same results that a bulk silicon-substrate device requires. This yields a power device with as much as 10 times the performance of a silicon-substrate power device. As a result, significant cost savings result.

OPERATION

Figure 6:
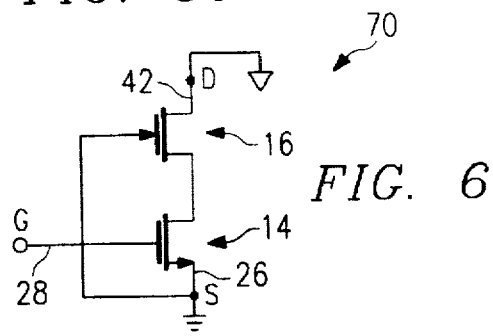
FIG. 6 illustrates an electrical circuit diagram that describes the operation of the embodiment of FIG. 3.

Having described the structure and fabrication of the illustrative embodiments, their operation is readily understandable. For completeness, however, FIG. 6 provides a circuit diagram to more completely describe the embodiments. Referring to FIG. 6, circuit diagram 70 illustrates that the circuit diagram for LV MOSFET portion 14" of FIG. 3 shows operation as a MOSFET that connects to drift region 16". Drift region 16" of FIG. 6 relates to the single-chip configuration of FIG. 3 and operates essentially as a JFET. In actuality, MOSFET portions 14 and 14' of FIGS. 1 and 2, respectively, operate the same as does LV MOSFET 14" of FIG. 3. Likewise, drift regions 16 and 16' of FIGS. 1 and 2 function the same as does drift region 16" of FIG. 3. Gate connection 28 connects to drift region 18 and LV MOSFET region 14", as well as to source connection 26. Drain 42 connects to the other circuitry with which the present embodiment may cooperate. The result is that power device 60 has the desired control characteristics of a silicon-based power device and has a lower $R_{ds(on)}$ that only GaAs of SiC power devices can provide.

In summary, the illustrative embodiments provide an improved high-voltage power device having a low $R_{ds(on)}$ relative to devices formed using only a silicon substrate. The power device includes a control circuit formed on a silicon substrate region comprising a low-voltage control device. A high-voltage circuit includes a high-voltage drift region and is formed in a non-silicon substrate region. The high-voltage circuit has a lower $R_{ds(on)}$ than would an equivalently configured silicon substrate-based high-voltage circuit. Connecting circuitry connects the control circuit with the high-voltage circuit to form a high-voltage device structure having control circuit performance characteristic of a silicon-substrate device and $R_{ds(on)}$ characteristics of a high-voltage device formed of a material having a high figure-of-merit.

Although the invention has been described with reference to the above-specified embodiments, this description is not meant to be construed in a limiting sense. Various modifications of the disclosed embodiment, as well as alternative embodiments of the invention, will become apparent to persons skilled in the art upon reference to the above description. It is, therefore, contemplated that the appended claims will cover such modifications that fall within the true scope of the invention.

What is claimed is:

1. A high-voltage power device structure having a low $R_{ds(on)}$, comprising:

a source region of a first conductivity type formed in a silicon substrate region;

a gate electrode located over said silicon substrate region adjacent said source region;

a high voltage doped drift region of said first conductivity type and a first dopant concentration located in a semiconductor region, said semiconductor region comprising at least one material other than silicon;

a doped drain region of said first conductivity type and a second dopant concentration greater than said first dopant concentration located in said high voltage drift region;

a first diffused region of said first conductivity type located in said silicon substrate region adjacent said gate electrode;

a second diffused region of said first conductivity type located in said high voltage drift region and connected to said first diffused region.

2. The device structure of claim 1, wherein said semiconductor region comprises a GaAs substrate region.

3. The device structure of claim 1, wherein said semiconductor region comprises a SiC substrate region.

4. The device structure of claim 1, wherein said high-voltage drift region is formed within a trench of said silicon substrate region.

5. The device structure of claim 1, wherein said high-voltage drift region is formed on a $SiO_2$ region separating said silicon substrate region from said high-voltage drift region.

6. The device structure of claim 1, wherein said silicon substrate region is formed on a first chip and said semiconductor region is formed on a second chip, said first chip being distinct from said second chip.

7. A method of forming a power device structure having a low $R_{ds(on)}$ comprising the steps of:

forming a gate electrode over a silicon substrate region;

forming a source region of a first conductivity type and a first diffused region of said first conductivity type in said silicon substrate region;

forming a high voltage doped drift region of said first conductivity type and a first dopant concentration in a semiconductor region, said semiconductor region comprising at least one non-silicon material;

forming a second diffused region of said first conductivity type and a doped drain region of said first conductivity type and a second dopant concentration greater than said first dopant concentration in said high voltage drift region; and connecting said first diffused region to said second diffused region.

8. The method of claim 7, wherein said semiconductor region comprises a GaAs substrate region.

9. The method of claim 7, wherein said semiconductor region comprises a SiC substrate region.

10. The method of claim 7, wherein said high-voltage drift region is formed within a trench of said silicon substrate region.

11. The method of claim 7, wherein said high-voltage drift region is formed on a $SiO_2$ region separating said silicon substrate region from said high-voltage drift region.

12. The method claim 7, wherein said silicon substrate region is formed on a first chip and said semiconductor region is formed on a second chip, said first chip being distinct from said second chip.

13. A hybrid power MOSFET comprising:

a source region formed in a silicon substrate region;

a gate electrode located over said silicon substrate region adjacent said source region;

a high voltage doped drift region of a first conductivity type and a first dopant concentration located in a non-silicon-only semiconductor region; and a doped drain region of the first conductivity type and a second dopant concentration greater than said first dopant concentration located in said high voltage drift region.

14. The hybrid power MOSFET of claim 13 further comprising:

a first diffused region located in said silicon substrate region adjacent said gate electrode;

a second diffused region located in said high voltage drift region and connected to said first diffused region.

15. The hybrid power MOSFET of claim 13, wherein said non-silicon-only semiconductor region comprises a GaAs substrate region.

16. The hybrid power MOSFET of claim 13, wherein said non-silicon-only semiconductor region comprises a SiC substrate region.

17. The hybrid power MOSFET of claim 13, wherein said high-voltage drift region is formed within a trench of said silicon substrate region.

18. The hybrid power MOSFET of claim 13, wherein said high-voltage drift region is formed on a $SiO_2$ region separating said silicon substrate region from said high-voltage drift region.

19. The hybrid power MOSFET of claim 13, wherein said silicon substrate region is formed on a first chip and said non-silicon-only semiconductor region is forming on a second chip, said first chip being distinct from said second chip.

* * * * *